(12) United States Patent
Wang

(10) Patent No.: US 6,897,475 B2
(45) Date of Patent: May 24, 2005

(54) TEST STRUCTURE AND RELATED METHODS FOR EVALUATING STRESS-INDUCED VOIDING

(75) Inventor: Chien-Jung Wang, Kaohsiung (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 75 days.

(21) Appl. No.: 10/419,617

(22) Filed: Apr. 21, 2003

(65) Prior Publication Data

US 2004/0207383 A1 Oct. 21, 2004

(51) Int. Cl.[7] .......................... H01L 23/58; H01L 21/66
(52) U.S. Cl. .......................... 257/48; 324/71.1; 438/14; 438/18
(58) Field of Search .......................... 257/48; 324/71.1, 324/71.5; 438/14, 17, 18

(56) References Cited

U.S. PATENT DOCUMENTS 6,570,181 B1 * 5/2003 Graas et al. .................. 257/48
6,747,445 B2 * 6/2004 Fetterman et al. ......... 324/71.1
2004/0026693 A1 * 2/2004 McLaughlin et al. ......... 257/48
2004/0129938 A1 * 7/2004 Landers et al. ............... 257/48

* cited by examiner

*Primary Examiner*—Asok Kumar Sarkar
(74) *Attorney, Agent, or Firm*—Slater & Matsil, L.L.P.

(57) ABSTRACT

This disclosure provides, in one aspect, a test structure formed within a semiconductor wafer. In one embodiment, the test structure comprises a plurality of first level bulk metals having varying sizes, where adjacent ones of the plurality of first level bulk metals are coupled together using vias connected to second level thin conductors located therebetween. In addition, the test structure comprises a plurality of second level bulk metals having varying sizes, where adjacent ones of the plurality of second level bulk metals are coupled together using vias connected to first level thin conductors located therebetween. Furthermore, the test structure includes a first level contact pad coupled to a smallest of the plurality of second level bulk metals, and a second level contact pad coupled to a largest of the plurality of first level bulk metals. In such an embodiment, a largest of the second level bulk metals coupled to a smallest of the first level bulk metals. In other aspects, this disclosure provides a method of manufacturing a test structure within a semiconductor wafer, and a method of evaluating stress-induced voiding of metals within a semiconductor wafer.

7 Claims, 2 Drawing Sheets

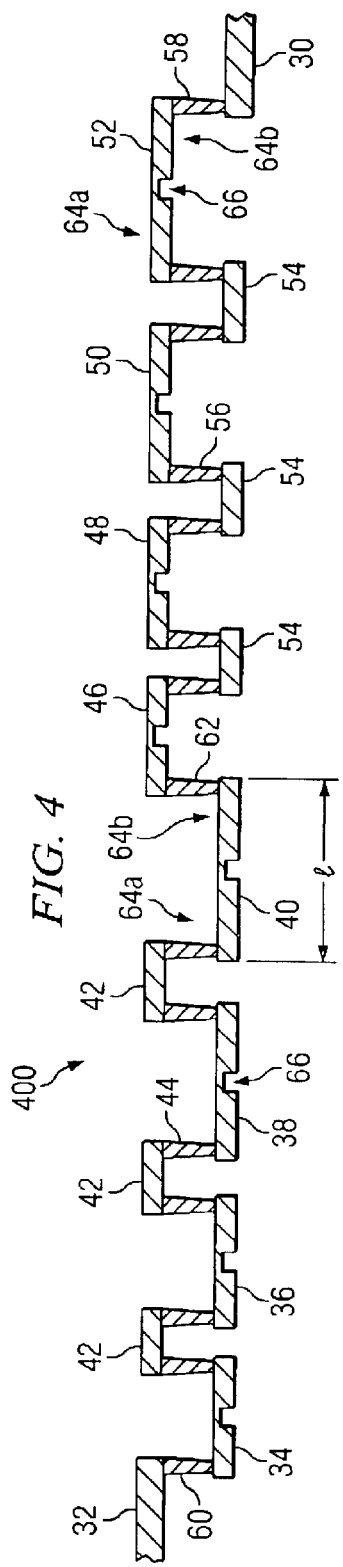
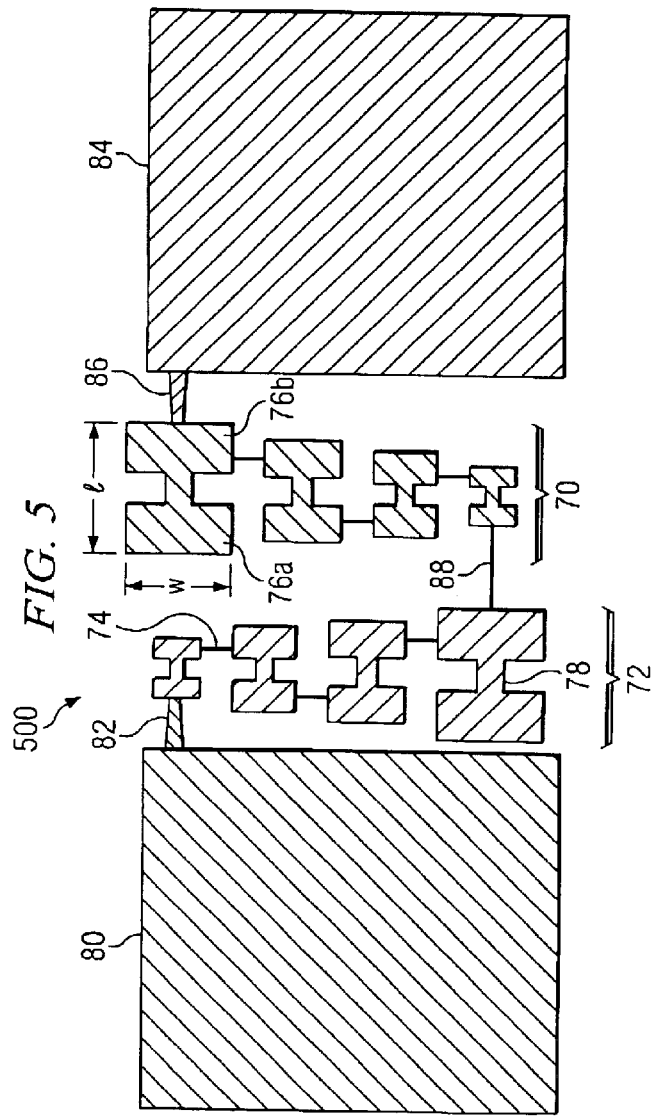

TEST STRUCTURE AND RELATED METHODS FOR EVALUATING STRESS-INDUCED VOIDING

TECHNICAL FIELD OF THE INVENTION

This disclosure relates, in general, to semiconductor processes, and more specifically, to test structures and related methods, for evaluating stress-induced voiding in components and interconnects within semiconductor wafers.

BACKGROUND OF THE INVENTION

The manufacture of integrated circuits on semiconductor wafers has continued to allow electrical devices to become more compact, yet with improved performance and greater capabilities. As a result, manufacturers are constantly improving on the manufacturing techniques and processes for the semiconductor devices forming these integrated circuits. In addition, as manufacturing processes for semiconductor devices and interconnects become more complex, techniques for testing the results of such processes become more important. Specifically, modem processes typically include the manufacture of test wafers, built having multiple test structures that allow manufacturers to perform a variety of tests in order to evaluate the potential performance of finished wafers manufactured with the same processes. Although test wafers permit such testing, current manufacturing techniques often include producing test structures within production wafers, allowing manufacturers to perform performance testing within actual wafers to be sold to customers. With this approach, manufacturers may obtain more accurate performance evaluations by testing structures within the actual wafers produced for customers.

One particular test structure commonly employed by today's manufacturers is the evaluation of stress-induced voiding among the interconnections between vias and inter-level metal conductors in the various levels of semiconductor wafers. Stress-induced voiding typically refers to the development of defects at these interconnection points to the degree of causing voids, e.g., open circuits. Such stress-induced voiding may manifest itself in several ways.

Referring initially to FIG. 1, illustrated is an interlevel interconnection 100 suffering failure from one type of stress-induced voiding that may occur during the manufacture of semiconductor wafers. The interconnection 100 includes a thin conductor 2 coupled to a bulk metal layer 4 with an interconnecting via 6. As illustrated, the thin conductor 2 is formed on a higher level than the bulk metal layer 4. As the interconnection 100 undergoes stress during operation, for example, thermal stress, a failure area 8 develops as a result of stress-induced voiding. More specifically, with the thin conductor 2 on a higher level than the bulk metal 4, vacancies 10 around the connection point between the via 6 and the bulk metal 4 migrate towards the connection point forming microvoids. As the voids increase, the failure area 8 eventually develops resulting in increased resistance and in some cases an open circuit between the thin conductor 2 and the bulk metal 4.

Looking now at FIG. 2, illustrated is another interlevel interconnection 200 suffering failure from another type of stress-induced voiding. The interconnection 200 also includes a thin conductor 12 coupled to a bulk metal layer 14 with an interconnecting via 16. However, unlike the interconnection 100 in FIG. 1, the interconnection 200 in FIG. 2 has the thin conductor 12 formed on a lower level than the bulk metal layer 14. With this formation, as the interconnection 200 undergoes stress during operation, the tensile stress in the bulk metal 14 increases causing the bulk metal 14 to move in the directions indicated by arrows A1 and A2. As the tensile stress in the bulk metal 14 increases, and the bulk metal 14 moves further in the directions denoted by arrows A1 and A2, the stress translates to the via 16, pulling it upwards, as denoted by arrow A3. As the via 16 is forced upwards by the tensile stress, the via 16 eventually pulls away from the thin conductor 12 causing an open circuit failure 18 between the thin conductor 12 and bulk metal 14.

In addition to the various types of failures caused by stress-induced voiding, the larger the metal layers involved, the more severe the migration of microvoids, in the case of a thin conductor over a bulk metal layer, and the more severe the tensile stress, in the case of the bulk metal over the thin conductor. As a result, the larger the metals (e.g., length and width) employed to form the interconnections, the higher the probability for failure from stress-induced voiding. As mentioned above, to evaluate the performance of the selected sizes, manufacturers employ test structures in production wafers.

FIG. 3 illustrates a conventional test structure 300 for evaluating stress-induced voiding among semiconductor wafer interconnections. As may be seen, two contact pads 20 are positioned on the same level, and located over a bulk metal 22. The bulk metal 22 is coupled to the contact pads 20 using vias 24. Although in the illustrated test structure 300, the bulk metal 22 is located below the contact pads 20, other conventional test structures are also in use having the bulk metal 22 positioned over the contact pads 20.

Unfortunately, regardless of which conventional test structure is employed, both suffer from similar deficiencies. More specifically, in order to evaluate the effects of stress-induced voiding on the multitude of metal structure sizes, each structure 300 includes bulk metal 22 having a selected length and width. The structure 300 may then be used to evaluate stress-induced voiding on that particular size of bulk metal 22. However, to evaluate stress-induced voiding on any other size, a separate test structure is formed, having bulk metal with a length and/or width different than bulk metal in the first structure.

As mentioned above, since the probability of failure due to stress-induced voiding constantly varies in proportion to the size of the interconnected metal layers, a great number of test structures, typically over 100, must be constructed in the production wafer to provide a complete spectrum of failure evaluation. As may be expected, such a large number of test structures occupies a tremendous amount of wafer real estate, reducing overall wafer yield and consequently increasing the overall cost of semiconductor device manufacture. Of course, less test structures may be formed on production wafers, but then the accuracy of evaluating stress-induced voiding failure probability is substantially decreased. Accordingly, what is needed in the art is a test structure, and related methods, for evaluating the probability of stress-induced voiding failures in semiconductor wafer interconnections that do not suffer from the deficiencies associated with conventional techniques.

SUMMARY OF THE INVENTION

To address the above-discussed deficiencies of the prior art, this disclosure provides, in one aspect, a test structure formed within a semiconductor wafer. In one embodiment, the test structure comprises a plurality of first level bulk metals having varying sizes, where adjacent ones of the plurality of first level bulk metals are coupled together using vias connected to second level thin conductors located therebetween. In addition, the test structure comprises a plurality of second level bulk metals having varying sizes, where adjacent ones of the plurality of second level bulk metals are coupled together using vias connected to first level thin conductors located therebetween. Furthermore, the test structure includes a first level contact pad coupled to a smallest of the plurality of second level bulk metals, and a second level contact pad coupled to a largest of the plurality of first level bulk metals. In such an embodiment, a largest of the second level bulk metals is coupled to a smallest of the first level bulk metals.

In another aspect, this disclosure provides a method of manufacturing a test structure within a semiconductor wafer. In one embodiment, the method includes forming a plurality of first level bulk metals having varying sizes, and a plurality of second level bulk metals having varying sizes, on the wafer. The method also includes coupling adjacent ones of the plurality of first level bulk metals together using vias connected to second level thin conductors located therebetween, and coupling adjacent ones of the plurality of second level bulk metals together using vias connected to first level thin conductors located therebetween. In addition, the method includes coupling a first level contact pad to a smallest of the plurality of second level bulk metals, coupling a second level contact pad to a largest of the plurality of first level bulk metals, and coupling a largest of the second level bulk metals to a smallest of the first level bulk metals.

In yet another embodiment, the disclosure provides a method of evaluating stress-induced voiding of metals within a semiconductor wafer. In one embodiment, the method includes electrically coupling a first probe to a first level contact pad coupled to a smallest of a plurality of second level bulk metals having varying sizes, where adjacent ones of the plurality of second level bulk metals are coupled together using vias connected to first level thin conductors located therebetween. The method also includes electrically coupling a second probe to a second level contact pad coupled to a largest of a plurality of first level bulk metals having varying sizes, where adjacent ones of the plurality of first level bulk metals are coupled together using vias connected to second level thin conductors located therebetween, a largest of the second level bulk metals coupled to a smallest of the first level bulk metals. Also, the method includes determining a resistance across the pluralities of first and second level bulk metals using the first and second probes.

The foregoing has outlined preferred and alternative features of the disclosed process so that those skilled in the art may better understand the detailed description that follows. Additional features of the invention will be described hereinafter that form the subject of the attached claims. Those skilled in the art should appreciate that they can readily use the disclosed conception and specific embodiments as a basis for designing or modifying other structures for carrying out the same purposes. Those skilled in the art should also realize that such equivalent constructions do not depart from the spirit and scope of the issued claims and their equivalents.

BRIEF DESCRIPTION OF THE DRAWINGS

For a more complete understanding, reference is now made to the following detailed description taken in conjunction with the accompanying drawings. It is emphasized that various features may not be drawn to scale. In fact, the dimensions of various features may be arbitrarily increased or reduced for clarity of discussion. In addition, it is emphasized that some components may not be illustrated for clarity of discussion. Reference is now made to the following descriptions taken in conjunction with the accompanying drawings, in which:

FIG. 4 illustrates a section view of one embodiment of a test structure constructed according to the principles disclosed herein; and FIG. 5 illustrates a plan view of another embodiment of a test structure for evaluating stress-induced voiding constructed according to the principles disclosed herein.

DETAILED DESCRIPTION

Figure 1:
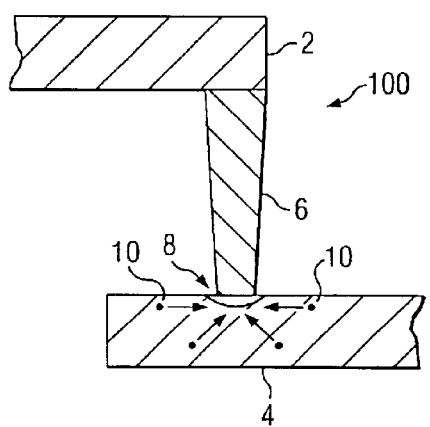
FIG. 1 illustrates an interlevel interconnection suffering failure from one type of stress-induced voiding that may occur during the manufacture of semiconductor wafers.
Figure 2:
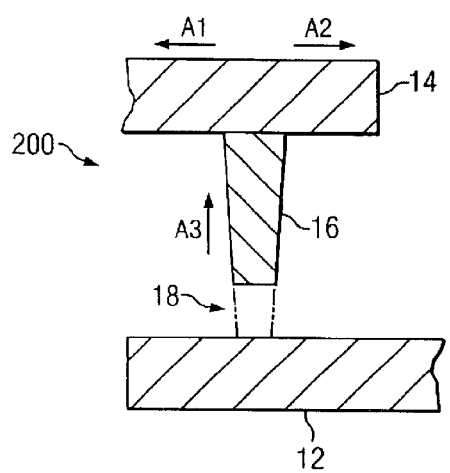
FIG. 2 illustrates another interlevel interconnection suffering failure from another type of stress-induced voiding.

In the following discussion, numerous specific details are set forth to provide a thorough understanding of the disclosure. However, those skilled in the art will appreciate that the techniques herein may be practiced without such specific details. In other instances, well-known elements have been illustrated in schematic or block diagram form in order not to obscure the disclosure in unnecessary detail. Additionally, some details have been omitted inasmuch as such details are not considered necessary to obtain a complete understanding of the disclosure, and are considered to be within the understanding of persons of ordinary skill in the relevant field of art.

Referring now to FIG. 4, illustrated is a section view of one embodiment of a test structure 400 constructed according to the principles disclosed herein. The test structure 400 includes a first contact pad 30 formed on a first level, and a second contact pad 32 formed on a second level, within the substrate layer levels of a semiconductor wafer. In practice, the contact pads 30, 32 may be bonding pads for use in electrically coupling the test structure 400 to outside circuits or components. In a specific embodiment, probes may be electrically coupled to the contact pads 30, 32 to evaluate stress-induced voiding within the test structure 400, as described below. Moreover, the contact pads 30, 32 may be comprised of any appropriate conductive material. In other embodiments, the contact pads 30, 32 may be electrically coupled using metallic conductors to other components or interconnects throughout the wafer, or may even be located away from the test structure 400 and coupled thereto using such metallic conductors.

The test structure 400 also includes a plurality of first level bulk metals 34, 36, 38, 40 formed on the first level. In an advantageous embodiment, the first level bulk metals 34, 36, 38, 40 are formed using aluminum, titanium, copper, or alloys thereof, but other useful materials may also be employed. As shown, the first level bulk metals 34, 36, 38, 40 have varying sizes with respect to one another. More specifically, each of the first level bulk metals 34, 36, 38, 40 has varying lengths (l) and/or widths (w) with respect to one another, as may be seen more clearly in FIG. 5. In addition, in the illustrated embodiment, the first level bulk metals 34, 36, 38, 40 are arranged in ascending sizes, when moving from the second contact pad 32 to the first contact pad 30.

To electrically couple each of the first level bulk metals 34, 36, 38, 40 together, adjacent ones of the first level bulk metals 34, 36, 38, 40 are coupled to second level thin conductors 42 located therebetween, but on the second level, using vias (one of which is designated 44) to reach the second level of the test structure 400. The second level thin conductors 42 may also be formed using aluminum, titanium, copper, alloys thereof, or other useful electrically conductive material. Although, in the illustrated embodiment, the first level is formed under the second level, the test structure 400 may be formed in a different manner, with the second level under the first level.

The test structure 400 also includes a plurality of second level bulk metals 46, 48, 50, 52 formed on the second level of the wafer, and also having varying sizes. Like the first level bulk metals 34, 36, 38, 40, the second level bulk metals 46, 48, 50, 52 vary in size by having varying lengths and/or widths with respect to one another, and may be formed using similar or different conductive material as was used to form first level bulk metals 34, 36, 38, 40. In the embodiment of FIG. 4, the second level bulk metals 46, 48, 50, 52 are arranged in descending sizes, when moving from the first contact pad 30 to the second contact pad 32; however, other arrangements are also possible. To electrically couple the second level bulk metals 46, 48, 50, 52 to each other, adjacent ones of a plurality of second level bulk metals 46, 48, 50, 52 are coupled to first level thin conductors 54 located therebetween, but on the first level, using vias (one of which is designated 56) to reach the first level of the test structure 400. As with the second level thin conductors 42, the first level thin conductors 54 may be formed from the same or different electrically conductive material.

To electrically couple the first level bulk metals 34, 36, 38, 40 and the second level bulk metals 46, 48, 50, 52 to allow testing in order to evaluate stress-induced voiding, the first contact pad 30, located on the first level, is coupled to the largest bulk metal 52 of the second level bulk metals 46, 48, 50, 52 using a via 58. Similarly, the second contact pad 32, which is located on the second level, is coupled to the smallest bulk metal 34 of the first level bulk metals 34, 36, 38, 40 also using a via 60. In addition, to complete the circuit, the largest bulk metal 40 of the first level bulk metals 34, 36, 38, 40 is coupled to the smallest bulk metal 46 of the second level bulk metals 46, 48, 50, 52, also using a via 62. In an exemplary embodiment, all of the vias 44, 56, 58, 60, 62 illustrated in FIG. 4 are formed from tungsten using conventional techniques, but other materials and techniques may also be employed.

Also in the illustrated embodiment, the first and second level bulk metals 34, 36, 38, 40, 46, 48, 50, 52 each comprise first and second portions 64a, 64b coupled together using metal traces 66 smaller in size than the first and second portions 64a, 64b to form an "H" structure. Although not necessary to practice the techniques disclosed herein, by forming the bulk metals with first and second portions 64a, 64b, a continuous metal/via chain, and thus a continuous electrical connection, is maintained in the test structure 400, while each of the portions 64a, 64b allow for two-pad measurements in the evaluation of stress-induced voiding. Other shapes will be apparent to those skilled in the art with routine experimentation. Techniques employable to evaluate stress-induced voiding are discussed in greater detail with reference to FIG. 5. Moreover, although only four of each of the first and second level bulk metals 34, 36, 38, 40, 46, 48, 50, 52 are illustrated, those who are skilled in the art understand that any number of bulk metals, and associated thin conductors 42, 54, may be formed in the test structure 400, without deviating from the broad scope of this disclosure. Advantageously, as the number of bulk metals employed in the test structure 400 increases, the number of conventional test structures replaced by the novel structure also increases.

To manufacture the test structure 400 within or on the substrates of a semiconductor wafer, the first level bulk metals 34, 36, 38, 40 may first be formed on a lower level of the wafer. As mentioned above, in one embodiment, aluminum may be employed to form the first level bulk metals 34, 36, 38, 40. The first level bulk metals 34, 36, 38, 40 are formed having various sizes, as illustrated in FIG. 4. To form the first level bulk metals 34, 36, 38, 40, a blanket layer of aluminum may first be deposited on the lower level of the substrate, and then a mask may be formed over portions of the aluminum layer that are to remain on the substrate. An etch may then be performed to remove the unmasked portions, leaving the first level bulk metals 34, 36, 38, 40 beneath the mask. Once the mask is removed, a dielectric layer may be formed over the first level bulk metals 34, 36, 38, 40, and the second level components of the test structure 400 formed over the dielectric layer in a similar manner.

In addition, the thin conductors 54 that will be used to connect the second level bulk metals 46, 48, 50, 52 may be formed at the same time as the first level bulk metals 34, 36, 38, 40 since they are also on the first level of the test structure 400. Also, the first level contact pad 30, which is also on the same level as the first level bulk metals 34, 36, 38, 40 and the thin conductors 54, is also formed. Advantageously, both the thin conductors 54 and the first level contact pad 30 may be formed using the mask and etch technique used to form the first level bulk metals 34, 36, 38, 40, and described in detail above. It should be understood, however, that other techniques may also be employed to construct the thin conductors 54 and the first level contact pad 30, as well as the first level bulk metals 34, 36, 38, 40. Those who are skilled in the art will know variations in process parameters and techniques for use with the disclosed method of manufacturing the test structure 400, all of which are within the scope of this disclosure.

Among the possible variations that may be employed is the manufacture of the first level bulk metals 34, 36, 38, 40 from copper. In such an embodiment, a damascene process, or dual-damascene process, may be employed, rather than the photolithographic technique described above for forming aluminum components. In such a damascene process, a dielectric layer is first formed over the wafer substrate using, for example, a chemical vapor deposition (CVD) process, and openings where the bulk metals and thin conductors will lay are made in the damascene dielectric layer using conventional photolithographic and etching techniques. As those who are skilled in the art understand, due to the different lateral dimensions of such openings, the patterning step may be performed twice, hence the "dual-damascene" process. Next, a barrier layer, which may be comprised of two different layers, may be formed in the openings to prevent diffusion of the copper into the surrounding regions of the wafer. Thereafter, the openings are filled with copper using, for example, a physical vapor deposition (PVD) process, to form the bulk metals 34, 36, 38, 40 and thin conductors 54. Once filled, excess barrier material and copper may be polished back to the surface of the damascene dielectric layer using a wafer polishing process, such as a chemical-mechanical polishing (CMP) process.

After either technique and once the dielectric layer has been formed over the first level, the vias 44, 56, 58, 60, 62 for the test structure 400 are formed. Specifically, the vias 44, 56, 58, 60, 62 may be formed in the dielectric layer by masking off certain areas of the dielectric layer. A blanket photolithographic mask may be deposited over the dielectric layer, and portions of the mask developed and removed where the vias 44, 56, 58, 60, 62 are to be formed. An etch may then be performed to create openings in the dielectric layer where the mask has been removed. The openings are etched down through the dielectric layer until the various metal components previously formed are reached. The openings are then filled with a conductive material, for example, tungsten, deposited using conventional techniques to create the vias 44, 56, 58, 60, 62. Any excess via material overflowing from the openings may then be removed using a wafer polishing technique, such as the CMP technique mentioned above.

Over the dielectric layer, as well as the vias 44, 56, 58, 60, 62, the plurality of second level bulk metals 46, 48, 50, 52 may then be formed. The second level bulk metals 46, 48, 50, 52 may be formed using aluminum, copper, or other appropriate metals and alloys, and are formed having varying sizes, as shown in FIG. 4. As with the first level bulk metals 34, 36, 38, 40, the second level bulk metals 46, 48, 50, 52 comprising aluminum may be formed by depositing a blanket layer of aluminum, and then masking portions of the layer that will remain. An etch may then be used to removed the unmasked portions, leaving the second level bulk metals 46, 48, 50, 52 formed on the second level, over the dielectric layer and over the first level of the wafer. Alternatively, the second level bulk metals 46, 48, 50, 52 could be formed using a damascene or dual damascene process as described above.

In addition, the thin conductors 42 that will be used to connect the first level bulk metals 34, 36, 38, 40 may be formed at the same time as the second level bulk metals 46, 48, 50, 52 since they are also on the second level of the test structure 400. Also, the second level contact pad 32, which is also on the same level as the second level bulk metals 46, 48, 50, 52 and the thin conductors 42, may also be formed using the same mask and etch technique used to form the second level bulk metals 46, 48, 50, 52. Of course, as before, those who are skilled in the art will know variations in process parameters and techniques for use with various metals, such as a damascene process for copper bulk metal and thin conductor structures, all of which are within the scope of this disclosure.

Turning now to FIG. 5, illustrated is a plan view of another embodiment of a test structure 500 for evaluating stress-induced voiding constructed according to the principles disclosed herein. The test structure 500 includes a plurality of first level bulk metals 70 formed on a first level (the first level is indicated by components having hatch marks), and a plurality of second level bulk metals 72 formed on a second level, above the first level. Of course, in other embodiments, the second level may be under the first level, and test structures constructed according to these principles are not limited to any particular stacking order.

As with the embodiment in FIG. 4, the first and second bulk metals 70, 72 of the test structure 500 comprise bulk metal structures having varying sizes, e.g., varying lengths and widths (l and w). However, now the first level bulk metals 70 are arranged in decending order, while the second level bulk metals are arranged in ascending order; however, other arrangements are still possible. Moreover, as mentioned above, the variation in length and width between individual ones of both the first and second level bulk metals 70, 72 may be easily seen in the plan view of FIG. 5.

As before, adjacent ones of the first and second level bulk metals 70, 72 are coupled together with thin conductors (one of which is designated 74), each located on a level opposite the level of the adjacent bulk metal it joins. Also as before, the first and second level bulk metals 70, 72 are coupled to the thin conductors 74 using vias constructed at approximately 90 degrees to reach the particular thin conductor 74 on the opposing level. In addition, the first and second level bulk metals 70, 72 are each constructed having first and second portions 76a, 76b, joined by a thin metal trace 78, to form an "H" structure, as discussed above. The test structure 500 also includes a first level contact pad 80, which in one embodiment is a bonding pad. As shown, the first level contact pad 80 is coupled to the smallest bulk metal of the plurality of second level bulk metals 72 using a via 82. Similarly, a second level contact pad 84 is provided, which may also be a bonding pad, and is coupled to the largest of the plurality of first level bulk metals 70 using a via 86. Although vias 82 and 86 are illustrated in FIG. 5 for purposes of explanation, one skilled in the art will recognize that the vias are preferably formed substantially normal to the surface of the wafer and might not be visible in a true plan view.

The test structure 500 of FIG. 5 also includes an advantage in layout not enjoyed by the embodiment illustrated in FIG. 4. More specifically, the smallest of the second level bulk metals 72 is formed proximate and adjacent the largest of the first level bulk metals 70. Also, the largest of the second level bulk metals 72 is formed proximate and adjacent the smallest of the first level bulk metals 70. In addition, the largest of the second level bulk metals 72 is coupled to the smallest of the first level bulk metals 70 using a via 88 to electrically complete the circuit of the test structure 500. By arranging the pluralities of first and second level bulk metals 70, 72 in this manner, the footprint of the test structure 500 is beneficially arranged. Specifically, the placement of each of the bulk metals 70, 72 is carefully selected so that less wafer real estate is occupied by the test structure 500 than the test structure 400 of FIG. 4. Moreover, the test structure 500 may be manufactured using a technique similar to that used to manufacture the test structure 400 in FIG. 4; however, other techniques are also within the scope of this disclosure, as mentioned above. However, regardless of the layout, either the test structure 400 in FIG. 4 or the test structure 500 in FIG. 5 occupies less wafer real estate than numerous conventional test structures typically used by employing the pluralities of multi-level bulk metals having varying sizes in a single test structure.

To perform an evaluation of stress-induced voiding of the interconnections manufactured in semiconductor wafers, the test structure 500 may be formed on the same production wafer. Although test structures, such as those in FIGS. 4 and 5, may be formed on a separate test wafer, semiconductor manufacturers often prefer to perform their testing on actual production wafers, to ensure the highest quality of product for their customers. One embodiment of a method of evaluating stress-induced voiding using the test structure 500 includes electrically coupling a first probe (not shown) to the first level contact pad 80. A second probe (not shown) is then electrically coupled to the second level contact pad 84.

Once the probes are electrically coupled, a small voltage, for example, about 2 V, may then be applied across the contact pads 80, 84. Because the contact pads 80, 84 arc electrically coupled through the other components of the test structure 500, a current passing through the entire test structure 500 may be measured. From the current measurement and the applied voltage, a resistance of the test structure 500 may then be calculated. In addition, current measurements are taken, and resistance calculations are made, using the test structure 500 under different degrees of thermal stress. More specifically, resistance calculations may be taken with the wafer at room temperature, and then placed under thermal stress by, for instance, baking the wafer at an ambient temperature of about 175° C. for many hours. Once under the thermal stress, current measurements arc again made, and resistance values re-calculated, to determine changes in resistance as a result of the thermal stress.

As those who are skilled in the art understand, stress-induced voiding will induce resistance increases when the wafer is under thermal stress. As mentioned above, when bulk metals are formed above thin conductors, stress-induced voiding in the form of tensile stress in the bulk metal pulling the via away from the thin conductor results in an increase in resistance across the test structure 500. Likewise, stress-induced voiding in the form of microvoid migration when the bulk metal is formed below the thin conductor also results in an increase in resistance across the test structure 500. Since test structures constructed according to the principles disclosed herein include both arrangements of bulk metals/thin conductors in a single structure (e.g., having both components on different levels), stress-induced voiding present in either form may be detected with the novel test structure.

Figure 3:
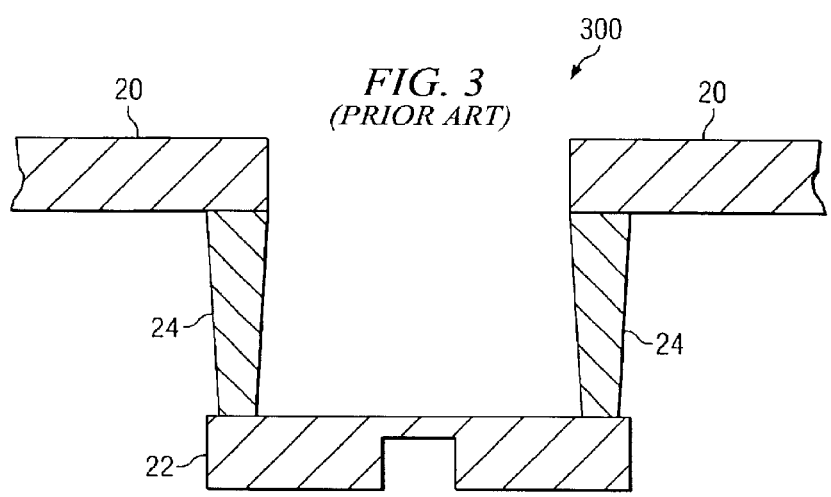
FIG. 3 illustrates a conventional test structure for evaluating stress-induced voiding among semiconductor interconnections.

Thus, with test structures constructed according to the principles disclosed herein, the varying sizes (length and width) of the pluralities of first and second level bulk metals permit the establishment of an index regarding the probability of failure, due to stress-induced voiding, of the different sizes. By establishing such an index, semiconductor wafer manufacturers may then employ this data to determine probabilities of failure of integrated circuit components and interconnects produced in the same wafer by the same or similar techniques. Moreover, with test structures employing multiple sizes of bulk metals, one single test structure may be used in place of several conventional test structures, such as the structure illustrated in FIG. 3. As a result, a far fewer number of test structures needs to be included in the wafer, reducing the amount of valuable wafer real estate occupied by test structures rather than operable circuitry. In addition, advantageous layouts of the various components of the novel test structure may also reduce the wafer real estate used. With less wafer real estate occupied by test structures, overall wafer yield may be increased, consequently decreasing the overall cost of semiconductor device manufacture.

Although various embodiments have been described in detail, those skilled in the art should understand that they may make various changes, substitutions and alterations herein without departing from the spirit and scope of the disclosure in its broadest form. For example, other metals or conductive materials could be used to form the various bulk metal, thin conductor and via features disclosed above. Although two metal levels have been disclosed, the inventive concept could readily be expanded to three or more metal levels. The specific "H" pattern and the use of four bulk metal features per metal level is not limiting and can be readily expanded upon through routine experimentation, with the benefit of the teachings provided herein. For instance, fewer or a greater number of bulk metal features could be employed per metal level. Additionally, additional contact pads could be employed to measure resistance over only a portion of the test structure. Likewise, although each bulk metal feature is disclosed with only two vias contacting it, additional vias could be employed to contact one or more of the bulk metal features. The size, shape and arrangement of the thin conductors could also be modified from the described embodiments and yet remain within the spirit of the invention. The particular embodiments disclosed above are illustrative only, and principles herein may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosure. Accordingly, the protection sought herein is as set forth in the claims below.

What is claimed is:

1. A test structure formed within a semiconductor wafer, comprising:

a plurality of first level bulk metal features having varying sizes, wherein adjacent features are coupled to second level thin conductors connected to vias located therebetween;

a plurality of second level bulk metal features having varying sizes, wherein adjacent features are coupled to first level thin conductors connected to vias located therebetween;

a first level contact pad coupled to a smallest of the plurality of second level bulk metal features; and a second level contact pad coupled to a largest of the plurality of first level bulk metal features, a largest of the second level bulk metals coupled to a smallest of the first level bulk metals.

2. The test structure as recited in claim 1, wherein the plurality of first level bulk metal features having varying sizes comprises a plurality of first level bulk metal features having varying lengths and widths, and wherein the plurality of second level bulk metal features having varying sizes comprises a plurality of second level bulk metal features having varying lengths and widths.

3. The test structure as recited in claim 1, wherein the plurality of first level bulk metal features having varying sizes are arranged in ascending size, and the plurality of second level bulk metal features having varying sizes are arranged in descending size.

4. The test structure as recited in claim 1, wherein each of the first and second level bulk metal features each comprises first and second portions coupled together using a metal trace.

5. The test structure as recited in claim 1, wherein the first level bulk metal features are located on a level over a level of the second level bulk metal features.

6. The test structure as recited in claim 1, wherein a smallest of the second level bulk metal features is located proximate a largest of the first level bulk metal features; and wherein a largest of the second level bulk metal features is located proximate a smallest of the first level bulk metal features and coupled thereto using a via.

7. The test structure as recited in claim 1, wherein the first level contact pad is coupled to a smallest of the plurality of second level bulk metal features using a via, and the second level contact pad is coupled to a largest of the plurality of first level bulk metal features using a via.

* * * * *

UNITED STATES PATENT AND TRADEMARK OFFICE
CERTIFICATE OF CORRECTION

PATENT NO. : 6,897,475 B2
DATED : May 24, 2005
INVENTOR(S) : Wang

It is certified that error appears in the above-identified patent and that said Letters Patent is hereby corrected as shown below:

Column 10,
Line 33, delete "metals." and insert -- metal features. --.

Signed and Sealed this

Sixteenth Day of August, 2005

JON W. DUDAS
*Director of the United States Patent and Trademark Office*